(12) United States Patent
Iguchi et al.

(10) Patent No.: US 10,077,064 B2
(45) Date of Patent: Sep. 18, 2018

(54) GRIP DETECTION DEVICE

(71) Applicant: FUJIKURA LTD., Tokyo (JP)

(72) Inventors: Yusuke Iguchi, Sakura (JP); Takeshi Togura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 84 days.

(21) Appl. No.: 15/116,973

(22) PCT Filed: Feb. 9, 2015

(86) PCT No.: PCT/JP2015/053567
§ 371 (c)(1),
(2) Date: Aug. 5, 2016

(87) PCT Pub. No.: WO2015/119285
PCT Pub. Date: Aug. 13, 2015

(65) Prior Publication Data
US 2017/0166236 A1    Jun. 15, 2017

(30) Foreign Application Priority Data

Feb. 7, 2014    (JP) ................................. 2014-022272

(51) Int. Cl.
*B62D 1/04*    (2006.01)
*G01R 27/26*    (2006.01)
*G01D 5/24*    (2006.01)

(52) U.S. Cl.
CPC ............... *B62D 1/046* (2013.01); *G01D 5/24* (2013.01); *G01R 27/2605* (2013.01)

(58) Field of Classification Search
CPC combination set(s) only.
See application file for complete search history.

(56) References Cited

U.S. PATENT DOCUMENTS 9,267,809 B2    2/2016    Karasawa et al.
2003/0071738 A1    4/2003    Joly et al.
(Continued)

FOREIGN PATENT DOCUMENTS

DE    102009058138 A1    6/2011
DE    102010053354 A1    8/2011
(Continued)

OTHER PUBLICATIONS

Extended (supplementary) European Search Report dated Jan. 19, 2017, issued in counterpart European Patent Application No. 15746668.1. (5 pages).
(Continued)

*Primary Examiner* — Anne Marie Antonucci
*Assistant Examiner* — Renee Marie Larose
(74) *Attorney, Agent, or Firm* — Westerman, Hattori, Daniels & Adrian, LLP

(57) ABSTRACT

A grip detection device comprises an electrostatic capacity sensor mounted on a rim of a steering wheel; and a determination unit that detects gripping of the steering wheel based on a detection result of the electrostatic capacity sensor, a plurality of electrode units of elongated shape configuring the electrostatic capacity sensor extending along a direction in which the rim extends and being provided in parallel along a circumferential direction of the rim, of the plurality of electrode units, at least two electrode units are commonly connected, and at least one electrode unit not commonly connected to the commonly connected two electrode units is disposed between the commonly connected two electrode units, the determination unit determining that a driver has gripped the steering wheel when proximity of a human body has been detected by each of at least two electrode units not commonly connected to each other.

6 Claims, 10 Drawing Sheets

(56) References Cited

U.S. PATENT DOCUMENTS

| | | | |
|---|---|---|---|
| 2003/0189493 A1 | 10/2003 | Klausner et al. | |
| 2006/0274055 A1 | 12/2006 | Reynolds et al. | |
| 2010/0073319 A1* | 3/2010 | Lyon | G06F 3/044 345/174 |
| 2011/0254572 A1 | 10/2011 | Yamaguchi et al. | |
| 2015/0048845 A1* | 2/2015 | Petereit | H03K 17/955 324/663 |

FOREIGN PATENT DOCUMENTS

| | | |
|---|---|---|
| JP | 64-51564 U | 3/1989 |
| JP | 5-310130 A | 11/1993 |
| JP | 2000-228126 A | 8/2000 |
| JP | 2003-50282 A | 2/2003 |
| JP | 2003-535757 A | 12/2003 |
| JP | 2008-87566 A | 4/2008 |
| JP | 2009-302004 A | 12/2009 |
| JP | 2013-75653 A | 4/2013 |
| JP | 2013-178725 A | 9/2013 |
| JP | 2014-19355 A | 2/2014 |
| WO | 2010/050607 A1 | 5/2010 |

OTHER PUBLICATIONS

International Search Report dated May 12, 2015, issued in counterpart International Application No. PCT/JP2015/053567, w/English translation (5 pages).
Office Action dated May 29, 2018, issued in counterpart Japanese Application No. 2014-022272, with English machine translation. (6 pages).

* cited by examiner

A-A' Cross Section

B-B' Cross Section

C-C' Cross Section

D-D' Cross Section

E-E' Cross Section

GRIP DETECTION DEVICE

TECHNICAL FIELD

This invention relates to an electrostatic capacity sensor mounted on a steering wheel of an automobile and to a grip detection device employing the electrostatic capacity sensor.

BACKGROUND ART

A grip detection device that has an electrostatic capacity type sensor mounted on a steering wheel of an automobile and detects gripping of the steering wheel by a driver based on proximity detection of a human body by the electrostatic capacity type sensor, is known (Patent Document 1 and Patent Document 2).

In the grip detection device described in Patent Document 1, by mounting an electrostatic capacity touch panel on an annular shaped rim (gripping part) of the steering wheel, and determining that the driver is gripping the steering wheel when, of a large number of detection electrodes configuring the electrostatic capacity touch panel, the likes of a total area of the detection electrodes that have detected proximity of the human body is a certain value or more, a misdetection of gripping due to inadvertent contact of the driver is avoided.

In the grip detection device described in Patent Document 2, by disposing one each of detection electrodes on an inner circumferential side and an outer circumferential side of an annular shaped rim (gripping part) of the steering wheel, and determining that the driver is gripping the steering wheel when each of these two detection electrodes has detected proximity of the human body, a misdetection of gripping due to inadvertent contact of the driver is avoided.

PRIOR ART DOCUMENT

Patent Document

Patent Document 1: JP 2013-75653 A
Patent Document 2: JP 2014-19355 A

SUMMARY OF INVENTION

Problem to be Solved by the Invention

However, in the grip detection device disclosed in Patent Document 1, an electrostatic capacity touch panel having a large number of two-dimensionally disposed detection electrodes is used, hence the number of wirings to a sensor IC also increases, and a structure is complicated.

On the other hand, in the grip detection device disclosed in Patent Document 2, although there are only two detection electrodes disposed on the rim hence both the number of wirings to a sensor IC is few and a structure is simple, the driver, when gripping the steering wheel, has to consciously bring their finger close to each of two detection electrodes disposed at distant positions to grip the steering wheel, and grip detection performance is low.

The present invention was made in view of the above-described problems, and has an object of providing an electrostatic capacity sensor and grip detection device that achieve simplification of structure by reducing the number of wirings and achieve prevention of a lowering of grip detection performance of the steering wheel.

Means for Solving the Problem

An electrostatic capacity sensor according to the present invention is an electrostatic capacity sensor mounted on a rim of a steering wheel, includes: a flexible substrate having an insulating property; and a plurality of electrode units comprising an electrostatic capacity detection electrode of elongated shape provided on said flexible substrate, and is characterized in that a plurality of said electrode units are configured so as to be mounted on said rim so as to extend along a direction in which said rim extends, and are configured so as to be provided in parallel along a circumferential direction of said rim having the direction in which said rim extends as its axial center, and in a plurality of said electrode units, at least two electrode units are commonly connected, and at least one electrode unit not commonly connected to the commonly connected two electrode units is disposed between the commonly connected two electrode units.

Note that in the present invention. "a direction in which the rim extends" refers to a direction following an outer form shape of the rim, and in the case of an annular shaped rim, for example, refers to a direction following an annular shape. In addition, "a circumferential direction of the rim having the direction in which the rim extends as its axial center" refers to a direction following an outer circumference of a rim cross section when the rim is sectioned in a plane perpendicularly crossing the direction in which the rim extends, and in the description below, is sometimes called a circumferential direction of the rim.

Due to the electrostatic capacity sensor according to the present invention, a plurality of electrode units comprising an electrostatic capacity detection electrode of elongated shape are mounted on the rim so as to extend along a direction in which the rim extends, and are configured so as to be provided in parallel along a circumferential direction of the rim, hence a sensor structure is simple. Moreover, in the plurality of electrode units, at least two electrode units are commonly connected, and at least one electrode unit not commonly connected to the commonly connected two electrode units is disposed between the commonly connected two electrode units, hence each of the electrode units is provided in parallel such that electrode units not commonly connected to each other are disposed in vicinity, and the number of wirings extending from the plurality of electrode units to a detection circuit can be reduced without lowering grip detection performance.

Note that in the above-described electrostatic capacity sensor, the plurality of electrode units may be configured such that adjacent electrode units are not commonly connected each other.

Moreover, in the above-described electrostatic capacity sensor, the plurality of electrode units may be formed on a common flexible substrate.

Moreover, in the above-described electrostatic capacity sensor, the flexible substrate may be divided into a plurality of flexible substrate pieces, and commonly connected electrode units may be formed on an identical flexible substrate piece, and an electrode unit not commonly connected to the commonly connected electrode units may be formed on a different flexible substrate piece.

In addition, a grip detection device according to the present invention is a grip detection device, comprising: a steering wheel; an electrostatic capacity sensor mounted on a rim of said steering wheel: and a determination unit that determines whether a driver has gripped the steering wheel or not based on proximity detection of a human body by said electrostatic capacity sensor, the grip detection device being characterized in that the electrostatic capacity sensor includes a plurality of electrode units comprising an electrostatic capacity detection electrode of elongated shape, a plurality of said electrode units extend along a direction in which said rim extends, and are provided in parallel in a circumferential direction of said rim having the direction in which said rim extends as its axial center, in a plurality of said electrode units, at least two electrode units are commonly connected, and at least one electrode unit not commonly connected to the commonly connected two electrode units is disposed between the commonly connected two electrode units, and said determination unit determines that the driver has gripped the steering wheel when proximity of the human body has been detected by each of at least two electrode units not commonly connected to each other.

Due to the grip detection device according to the present invention, as mentioned above, the sensor structure can be simplified, and the number of wirings extending from the plurality of electrode units to a detection circuit can be reduced without lowering grip detection performance.

That is, in the grip detection device according to the present invention, a determination unit determines that a driver has gripped the steering wheel when proximity of a human body has been detected by each of at least two electrode units not commonly connected to each other, hence a gripping misdetection due to inadvertent contact of the driver can be avoided. Moreover, the plurality of electrode units provided in parallel along a circumferential direction of the rim are configured such that at least one electrode unit not commonly connected to commonly connected two electrode units is disposed between the commonly connected two electrode units, and such that electrode units not commonly connected to each other are disposed in vicinity, hence prevention of a lowering of grip detection performance can be achieved.

Note that in the above-described grip detection device, the plurality of electrode units may be divided into at least two groups, and electrode units belonging to an identical group may be commonly connected each other, and the determination unit may be configured to determine that the driver has gripped the steering wheel when proximity of the human body has been detected by each of one electrode unit and an electrode unit belonging to a different group from this one electrode unit.

Moreover, in the above-described grip detection device, the plurality of electrode units may be divided into at least three groups, and electrode units belonging to an identical group may be commonly connected each other, and the determination unit may be configured to determine that the driver has gripped the steering wheel when proximity of the human body has been detected by each of at least one electrode unit of all of different groups.

Moreover, in the above-described grip detection device, the plurality of electrode units provided in parallel along a circumferential direction of the rim may be disposed such that adjacent electrode units belong to different groups each other.

Effect of the Invention

The present invention makes it possible to achieve simplification of structure by reducing the number or wirings and to achieve prevention of a lowering of grip detection performance of the steering wheel.

EMBODIMENTS FOR CARRYING OUT THE INVENTION

Electrostatic capacity sensors and grip detection devices according to embodiments of the present invention will be described below with reference to the drawings.

[First Embodiment]

First, an electrostatic capacity sensor and a grip detection device employing the electrostatic capacity sensor, according to a first embodiment, will be described with reference to FIGS. 1 to 5.

Figure 1:
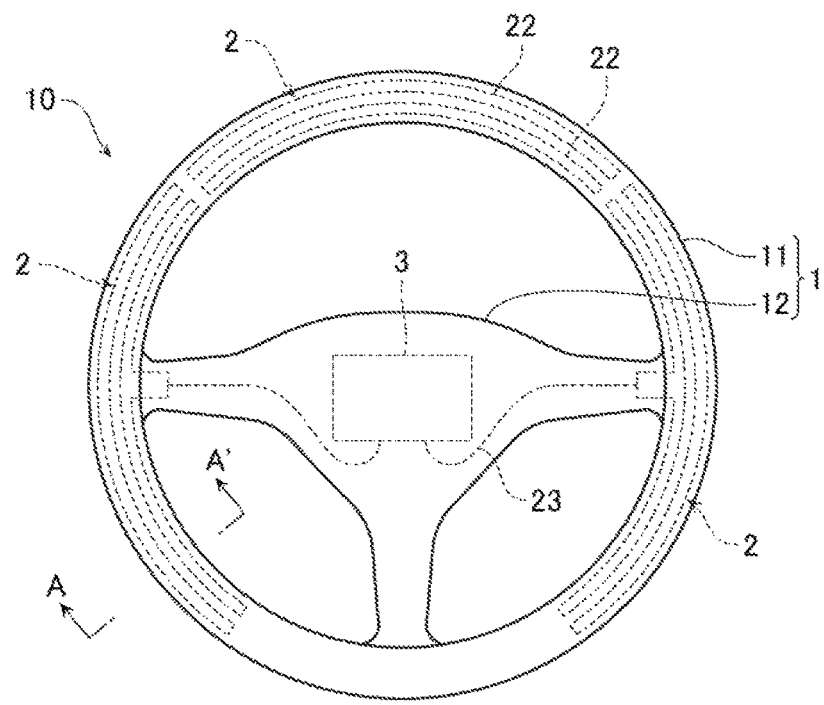
FIG. 1 is a schematic view of an arrangement example of an electrostatic capacity sensor and a grip detection device employing the same electrostatic capacity sensor, according to a first embodiment of the present invention.

FIG. 1 is a schematic view of an arrangement example to a steering wheel 1 of an electrostatic capacity sensor 2 according to the first embodiment, and of a grip detection device 10 employing said electrostatic capacity sensor 2.

FIG. 1 is a front view of the steering wheel 1 attached to a vehicle body as seen from a seat side, and in the present embodiment, three electrostatic capacity sensors 2 are mounted on a rim 11 of the steering wheel 1. Moreover, the grip detection device 10 according to the present embodiment is a steering wheel with a grip detection function, configured so as to detect gripping of the steering wheel by a driver, based on proximity detection of a human body by the electrostatic capacity sensor 2 mounted on the rim 11 of the steering wheel 1.

The steering wheel 1 includes: the rim 11 extending annularly; and a center unit 12 disposed at a center of its annulus, and the rim 11 and the center unit 12 are coupled via three spokes.

The steering wheel 1 is attached in a freely rotatable manner to the vehicle body, but the description below is assumed to describe up-down and right-left directions of the steering wheel 1 (rim 11) with reference to the steering wheel 1 in a steering state during direct forward motion of the vehicle (state shown in FIG. 1). Moreover, an inner circumferential side of the annulus of the annular rim 11 is sometimes called a rim inner circumferential side, and an outer circumferential side of the annulus of the annular rim 11 is sometimes called a rim outer circumferential side.

The electrostatic capacity sensor 2 is mounted in each of three regions of a right region, an upper region, and a left region of the annular rim 11 of the steering wheel 1.

The electrostatic capacity sensor 2 according to the first embodiment includes a plurality of electrode units comprising an electrostatic capacity detection electrode 22 of elongated shape, and the plurality of electrode units (each of the electrostatic capacity detection electrodes 22) extending along a direction in which the rim 11 extends are provided in parallel along a circumferential direction of the rim 11. Moreover, each of the electrode units (electrostatic capacity detection electrodes 22) is configured so as to detect proximity of the human body.

The grip detection device 10 according to the first embodiment is a steering wheel with a grip detection function, and comprises: the steering wheel 1; the electrostatic capacity sensor 2 mounted on the rim 11 of the steering wheel 1; and a determination unit 3 that determines whether the driver has gripped the steering wheel or not based on proximity detection of the human body by the electrostatic capacity sensor 2. Moreover, the plurality of electrode units (electrostatic capacity detection electrodes 22) configuring the electrostatic capacity sensor 2 are connected to the determination unit 3 provided within the center unit 12, via a contact wiring 23.

In the present embodiment, the right, upper, and left three regions of the annular rim 11 are each mounted with the electrostatic capacity sensor 2, but there may be one electrostatic capacity sensor 2 mounted over these three regions. Moreover, the electrostatic capacity sensor 2 may be mounted over the entire rim including a lower region.

Moreover, the determination unit 3 has been provided within the center unit 12 of the steering wheel 1, but may be provided in a place other than the center unit 12, or may be provided in another place separated from the steering wheel 1.

Figure 2:
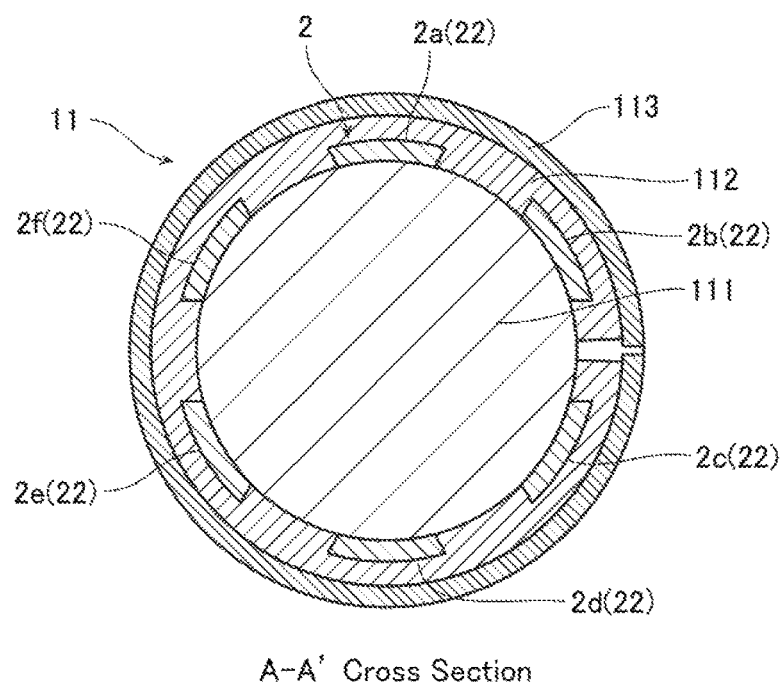
FIG. 2 is a cross-sectional view taken along the line A-A' in FIG. 1.

FIG. 2 is a cross-sectional view taken along the line A-A' of the rim 11 of the steering wheel 1 shown in FIG. 1.

The electrostatic capacity sensor 2 including six electrode units 2a-2f (electrostatic capacity detection electrodes 22) is mounted in a periphery of a core material 111 of substantially circular cross section configuring a central frame, on the rim 11 of the steering wheel 1. Moreover, its outer circumference is covered by a steering skin 113 configured from the likes of a leather material, via a cushioning material 112. Moreover, the six electrode units 2a-2f (electrostatic capacity detection electrodes 22) of the electrostatic capacity sensor 2 mounted on the rim 11 are provided in parallel separated at certain intervals (60° intervals) along the circumferential direction of the rim 11.

Note that by an outer circumference of the core material 111 mounted with the electrostatic capacity sensor 2 being covered by the steering skin 113 via the cushioning material 112, unevenness of an electrostatic capacity sensor 2 surface can be reduced. Moreover, adhesion of each of layers of the core material 111, the electrostatic capacity sensor 2, the cushioning material 112, and the steering skin 113 can be performed by a double-sided adhesive tape or an adhesive agent, for example.

Figure 3:
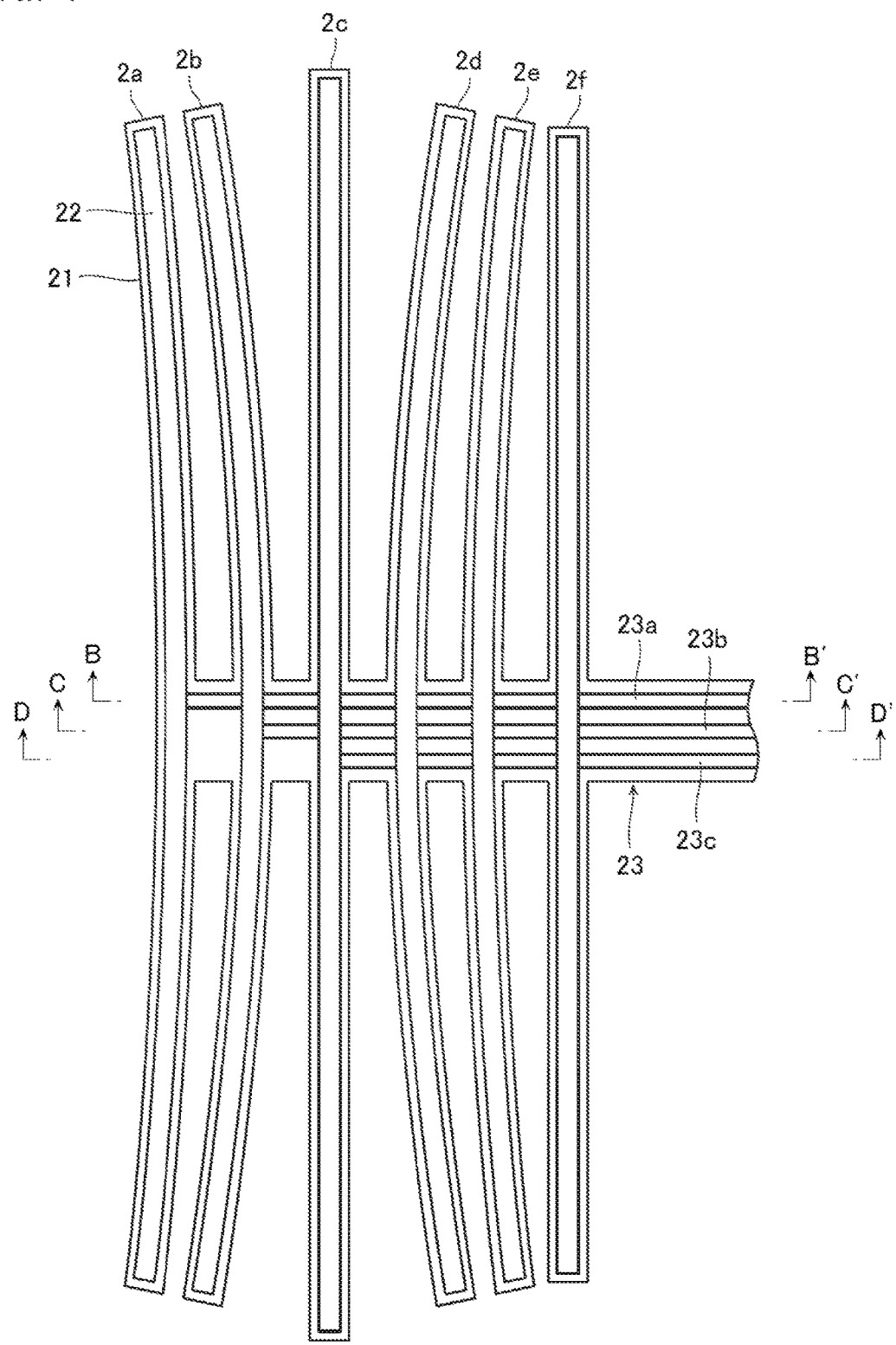
FIG. 3 is a plan view of the same electrostatic capacity sensor.
Figure 4A:
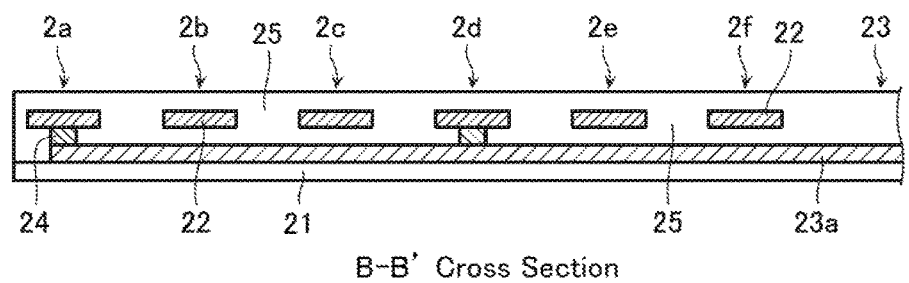
FIG. 4 is a cross-sectional view of the same electrostatic capacity sensor.

FIG. 3 is a plan view of the electrostatic capacity sensor 2 according to the first embodiment before steering wheel mounting; and FIGS. 4(a), (b), and (c) are respectively a cross-sectional view taken along the line B-B' shown in FIG. 3 looking in the direction of the arrows, a cross-sectional view taken along the line C-C' shown in FIG. 3 looking in the direction of the arrows, and a cross-sectional view taken along the line D-D' shown in FIG. 3 looking in the direction of the arrows.

As shown in FIG. 3, the electrostatic capacity sensor 2 includes: a flexible substrate 21 having an insulating property, and the electrostatic capacity detection electrode 22 formed on this flexible substrate 21.

The flexible substrate 21 can employ a film which is thin and has flexibility, of the likes of polyimide or PET, for example.

Moreover, the electrostatic capacity detection electrodes 22 on the flexible substrate 21 are formed by, for example, solid coating a carbon material, or forming the carbon material in a mesh state, on a solid state wiring of silver (Ag) or copper (Cu), a mesh state wiring of silver (Ag) or copper (Cu), or a border wiring due to these conductive materials, and are each formed in an elongated shape.

The electrostatic capacity sensor 2 includes the electrode units 2a-2f comprising six elongated shaped electrostatic capacity detection electrodes 22 formed on one flexible substrate 21, and these electrode units 2a-2f (electrostatic capacity detection electrodes 22) are provided in parallel along a direction crossing a longitudinal direction of the electrode units. Moreover, when the electrostatic capacity sensor 2 is mounted on the rim 11 of the steering wheel 1, the six elongated shaped electrode units 2a-2f (electrostatic capacity detection electrodes 22) are configured so as to each extend along the direction in which the rim 11 extends, and so as to be provided in parallel along the circumferential direction of the rim 11.

Moreover, in each of the electrostatic capacity detection electrodes 22 configuring the six electrode units 2a-2f, each of the electrostatic capacity detection electrodes 22 configuring the electrode units 2c, 2f disposed on the rim outer circumferential side and the rim inner circumferential side are formed in an elongated shape extending substantially in a straight line, and each of the electrostatic capacity detection electrodes 22 configuring the electrode units 2a, 2b, 2d, 2e disposed between those are formed in an arc shape matching a curvature of the rim 11. A radius of curvature of an arc shaped portion should be determined in view of the likes of flexibility and elasticity of the electrode units 2a-2f including the flexible substrate 21.

Each of the electrode units 2a-2f of the electrostatic capacity sensor 2 are connected to the determination unit 3 via the contact wiring 23.

The contact wiring 23 includes three wiring layers 23a-23c formed on the flexible substrate 21, and these wiring layers 23a-23c are formed extending in a direction crossing a longitudinal direction of the six electrode units 2a-2f (electrostatic capacity detection electrodes 22).

Figure 4B:
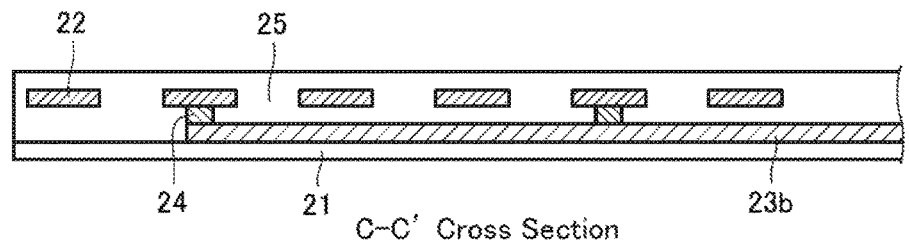
Figure 4C:
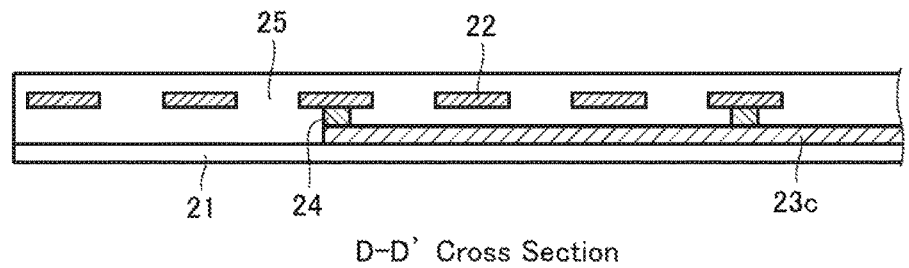

Moreover, as shown in FIGS. 4(a)-(c), each of the wiring layers 23a-23c is formed in a lower layer than each of the electrode units 2a-2f in a state of being insulated from each of the electrode units 2a-2f, at intersection portions with each of the electrode units 2a-2f. Note that the electrode units 2a-2f (electrostatic capacity detection electrodes 22) and the wiring layers 23a-23c formed on the flexible substrate 21 are each covered and protected, and moreover, insulated from each other, by an insulating layer 25 of the likes of a resist.

As shown in FIG. 4(a), the wiring layer 23a formed in a lower layer than each of the electrode units 2a-2f is connected to the two electrode units 2a, 2d (electrostatic capacity detection electrodes 22) via a through wiring 24, and commonly connects these two electrode units 2a, 2d. Moreover, as shown in FIG. 4(b), the wiring layer 23b is connected to the two electrode units 2b, 2e (electrostatic capacity detection electrodes 22) via a through wiring 24, and commonly connects these two electrode units 2b, 2e. Moreover, as shown in FIG. 4(c), the wiring layer 23c is connected to the two electrode units 2c, 2f (electrostatic capacity detection electrodes 22) via a through wiring 24, and commonly connects these two electrode units 2c, 2f.

Therefore, in the present embodiment, the number of wirings of the contact wiring 23 (the number of wiring layers 23a-23c) extending from the electrostatic capacity sensor 2 to the determination unit 3 is reduced (halved) compared to the number of electrodes (the number of electrode units 2a-2f) of the electrostatic capacity sensor 2.

Moreover, the six electrode units 2a-2f configuring the electrostatic capacity sensor 2 are arranged one-dimensionally, and the electrode units 2b, 2c not commonly connected to the two electrode units [2a, 2d] commonly connected by the wiring layer 23a, are disposed between these commonly connected two electrodes. Moreover, the electrode units 2c, 2d not commonly connected to the two electrode units [2b, 2e] commonly connected by the wiring layer 23b, are disposed between these commonly connected two electrodes; and the electrode units 2d, 2e not commonly connected to the two electrode units [2c, 2f] commonly connected by the wiring layer 23c, are disposed between these commonly connected two electrodes.

Furthermore, as shown in FIG. 2, the electrostatic capacity sensor 2 mounted on the rim 11 has the six electrode units 2a-2f provided in parallel at certain intervals (60° intervals) along the circumferential direction of the rim 11, and commonly connected two electrode units [2a, 2d], [2b, 2e], [2c, 2f] are respectively disposed at facing positions (180° intervals) each other. Moreover, in order that commonly connected electrode units are not disposed adjacently each other, the six electrode units 2a-2f provided in parallel along the circumferential direction of the rim 11 have the electrode units not commonly connected to commonly connected two electrode units respectively disposed between each of (between the two) commonly connected electrodes.

Figure 5:
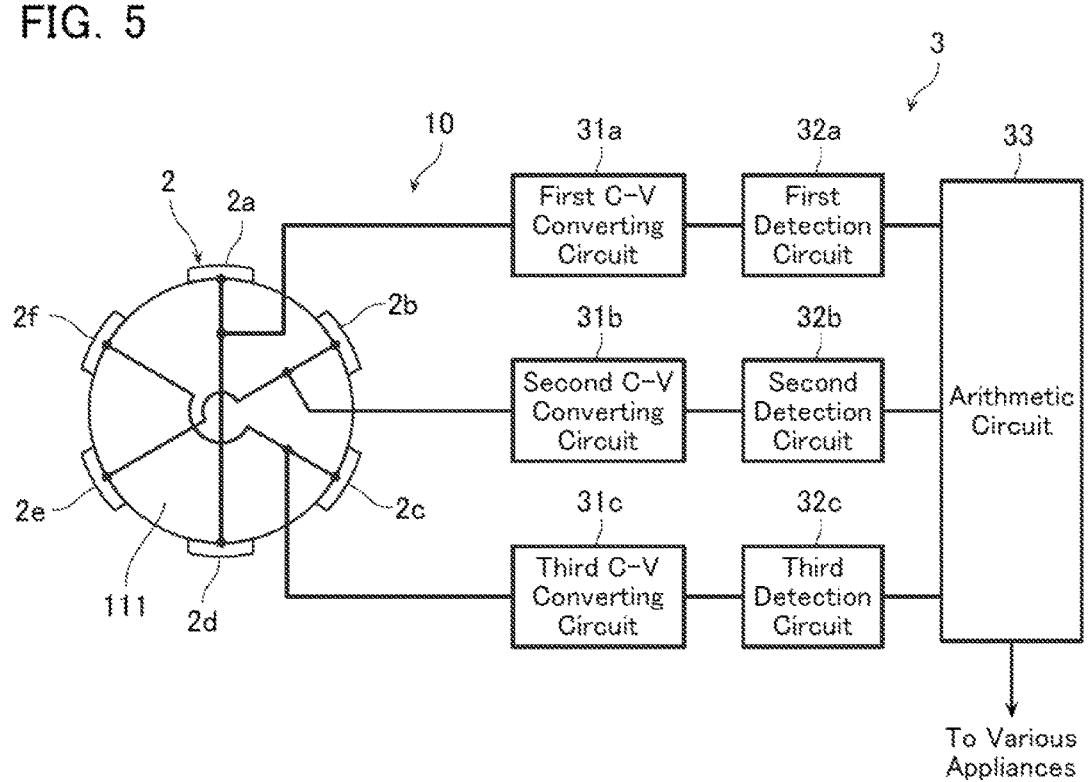
FIG. 5 is a block diagram of the grip detection device employing the same electrostatic capacity sensor.

FIG. 5 is a block diagram of the grip detection device 10 employing the electrostatic capacity sensor 2 of the present embodiment, and shows an electrical configuration of the electrostatic capacity sensor 2 and the determination unit 3.

The grip detection device 10 comprises: the electrostatic capacity sensor 2 mounted on the rim 11 of the steering wheel 1; and the determination unit 3 that detects gripping of the steering wheel by the driver based on proximity detection of the human body by each of the electrode units 2a-2f of the electrostatic capacity sensor 2, and three wirings extend from the electrostatic capacity sensor 2 to the determination unit 3.

The six electrode units 2a-2f configuring the electrostatic capacity sensor 2 are provided in parallel at substantially equal intervals (substantially 60° intervals) along the circumferential direction of the rim 11. Moreover, they are divided into three groups (first through third groups) such that one group is configured by electrode units disposed in facing positions each other, and electrode units belonging to an identical group [2a, 2d], [2b, 2e], [2c, 2f] are commonly connected each other. Moreover, adjacent electrode units (for example, 2f, 2a, 2b) are not commonly connected to each other, and respectively belong to different groups each other.

The determination unit 3 is configured comprising: first through third C-V converting circuits 31a-31c; first through third detection circuits 32a-32c; and an arithmetic circuit 33.

Moreover, the commonly connected two electrode units [2a, 2d] are wired to the first detection circuit 32a via the first C-V converting circuit 31a; the commonly connected two electrode units [2b, 2e] are wired to the second detection circuit 32b via the second C-V converting circuit 31b; and the commonly connected two electrode units [2c, 2f] are wired to the third detection circuit 32c via the third C-V converting circuit 31c.

The first C-V converting circuit 31a connects the mutually commonly connected two electrode units [2a, 2d] as part of an integrating circuit, and by generating a voltage pulse whose duty ratio changes by an electrostatic capacity value detected by the electrode units 2a, 2d, changes the electrostatic capacity value into a voltage pulse. Similarly, the second C-V converting circuit 31b connects the commonly connected two electrode units [2b, 2e] as part of an integrating circuit, and the third C-V converting circuit 31c connects the electrode units belonging to the third group [2c, 2f] as part of an integrating circuit, and by generating voltage pulses whose duty ratios change by electrostatic capacity values detected by the connected electrode units, change the electrostatic capacity values into voltage pulses.

The first through third detection circuits 32a-32c DC-convert the voltage pulse outputted from the first through third C-V converting circuits 31a-31c to compare with a certain threshold value, thereby detecting the electrostatic capacity value. Moreover, on the basis of the detected electrostatic capacity value, they detect proximity of the human body in the electrode units [2a, 2d], [2b, 2e], [2c, 2f] connected to each of the detection circuits 32a-32c, and, when proximity of the human body has been detected, make output to the arithmetic circuit 33 active.

The arithmetic circuit 33 is configured such that when only any one of the first through third detection circuits 32a-32c has become active, the driver is determined to have contacted the steering wheel, and when outputs of two or all of the first through third detection circuits 32a-32c have become active, the driver is determined to have gripped the steering wheel, distinguishes inadvertent contact and gripping of the steering wheel by the driver, and prevents a gripping misdetection.

Note that the arithmetic circuit 33 may be configured such that when outputs of one or two of the first through third detection circuits 32a-32c have become active, the driver is determined to have contacted the steering wheel, and when outputs of all of the first through third detection circuits 32a-32c have become active, the driver is determined to have gripped the steering wheel.

In this case, an angle range for distinguishing gripping can be set large. That is, even if, for example, a limp arm, or the like, contacts the steering wheel and proximity of the human body is detected by adjacent two electrode units (for example, electrode units 2a, 2b), the arithmetic circuit 33 does not determine gripping, and when the driver bends their finger to grip the rim 11 and proximity of the human body has detected by three electrode units (for example, electrode units 2a, 2b, 2c), the arithmetic circuit 33 determines gripping. As a result, a gripping misdetection when an arm or the like has inadvertently contacted can also be prevented.

As above, the electrostatic capacity sensor 2 according to the first embodiment has a one-dimensional arrangement structure in which six electrode units 2a-2f of elongated shape are provided in parallel along a direction crossing their longitudinal directions, and has a simple sensor structure.

Moreover, in the electrostatic capacity sensor 2 according to the first embodiment, the six electrode units 2a-2f have been provided in parallel along the circumferential direction of the rim, such that two electrode units [2a, 2d], [2b, 2e], [2c, 2f] are commonly connected each other and the contact wiring 23 (three wiring layers 23a-23c) is wired from the electrostatic capacity sensor 2 to the determination unit 3, and such that an electrode unit not commonly connected to commonly connected two electrode units is disposed between the commonly connected two electrode units, hence even if the number of wirings is reduced (halved), electrode units not commonly connected mutually to each other are disposed adjacently, and prevention of a lowering of grip detection performance can be achieved.

Moreover, the grip detection device 10 according to the first embodiment employs the above-described electrostatic capacity sensor 2 according to the first embodiment, hence simplification of sensor structure and reduction of the number of wirings can be achieved without lowering grip detection performance.

That is, in the grip detection device 10 according to the first embodiment, the determination unit 3 is configured such that when proximity of the human body is detected by at least two electrode units not commonly connected to each other and at least two of the first through third detection circuits 32a-32c have become active, the driver is determined to have gripped the steering wheel. As a result, a gripping misdetection due to inadvertent contact by the driver can be prevented. Moreover, the six electrode units 2a-2f provided in parallel at substantially equal intervals (substantially 60° intervals) along the circumferential direction of the rim 11 are each disposed such that adjacent electrode units belong to different groups each other and are thereby not commonly connected to each other, hence if proximity of the human body is detected by adjacent any two electrode units (any two electrode units disposed at substantially 60° intervals), at least two of the first through third detection circuits 32a-32c become active, and the determination unit 3 can determine that the driver has gripped the steering wheel.

[Second Embodiment]

Next, an electrostatic capacity sensor 2' according to a second embodiment of the present invention will be described with reference to FIGS. 6 and 7.

Figure 6C:
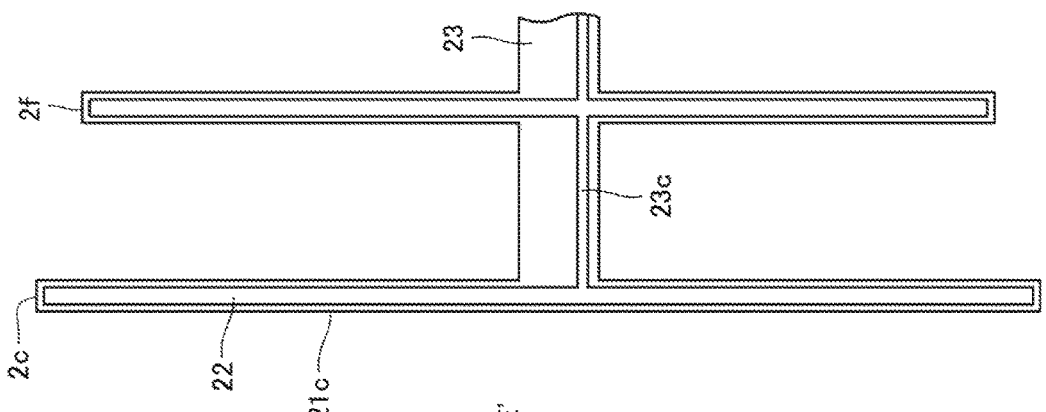
FIG. 6 is a plan view of an electrostatic capacity sensor according to a second embodiment of the present invention.
Figure 6B:
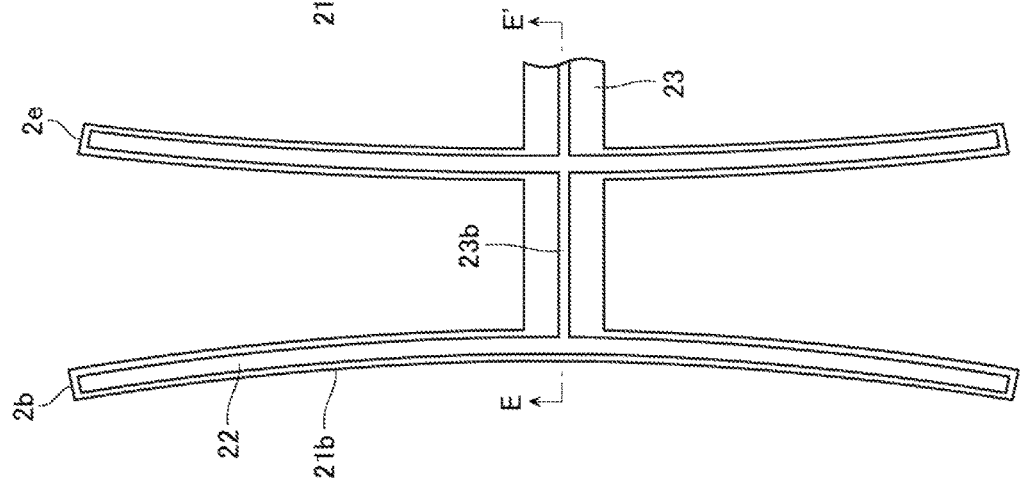
Figure 6A:
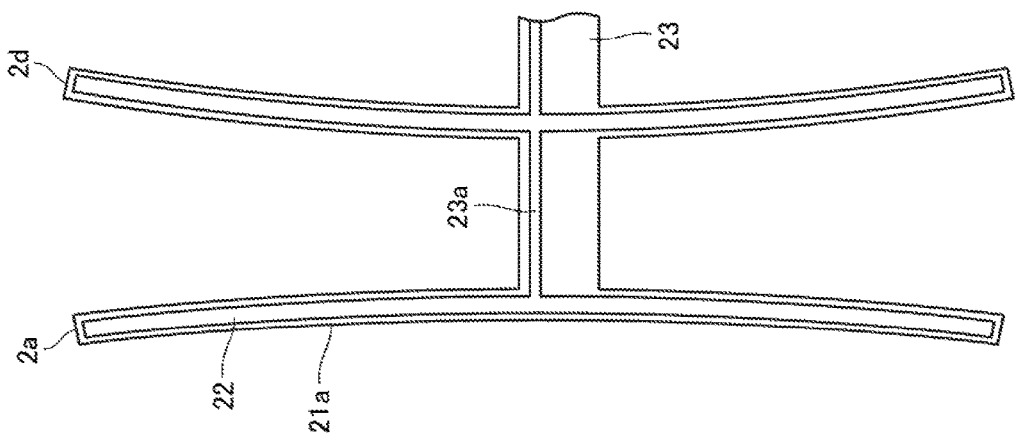
Figure 7:
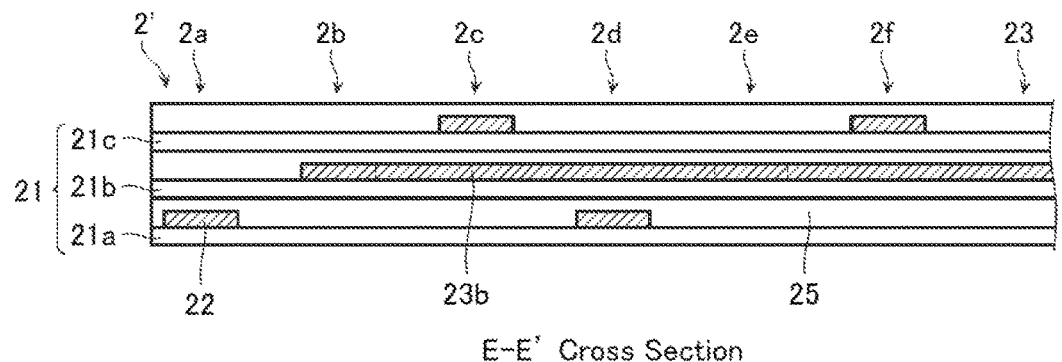
FIG. 7 is a cross-sectional of the same electrostatic capacity sensor.

FIG. 6 is an exploded plan view of the electrostatic capacity sensor 2' according to the second embodiment before steering wheel mounting; and FIG. 7 is a cross-sectional view of the electrostatic capacity sensor 2' according to the second embodiment taken along the line E-E' of FIG. 6(b) and looking in the direction of the arrows.

In FIGS. 6 and 7, configuration elements of an identical mode to those of the above-described first embodiment will be assigned with identical reference numerals to those assigned in the first embodiment, and descriptions thereof will be omitted.

As shown in FIG. 6, the electrostatic capacity sensor 2' of the second embodiment is configured such that the flexible substrate 21 is divided into three flexible substrate pieces 21a, 21b, 21c, and commonly connected electrode units (electrostatic capacity detection electrodes 22) of an identical group are formed for each of the flexible substrate pieces 21a-21c.

In this example, the two electrode units 2a, 2d (electrostatic capacity detection electrodes 22) are formed on the flexible substrate piece 21a, and the wiring layer 23a commonly connecting these is formed as a wiring pattern of an identical layer. Moreover, the two electrode units 2b, 2e (electrostatic capacity detection electrodes 22) are formed on the flexible substrate piece 21b, and the wiring layer 23b commonly connecting these is formed as a wiring pattern of an identical layer. Similarly, the two electrode units 2c, 2f (electrostatic capacity detection electrodes 22) are formed on the flexible substrate piece 21c, and the wiring layer 23c commonly connecting these is formed as a wiring pattern of an identical layer.

Moreover, the electrostatic capacity sensor 2' of the second embodiment can be formed by overlaying these three flexible substrate pieces 21a-21c, sequentially, from a lower layer, such that the respective electrode units 2a-2f are provided in parallel at fixed intervals.

FIG. 7 is a cross-sectional view of the electrostatic capacity sensor 2' according to the second embodiment formed overlaying the three flexible substrate pieces 21a-21c, cutting along the line E-E' of FIG. 6(b) and looking in the direction of the arrows.

As shown in FIG. 7, the electrostatic capacity sensor 2' according to the second embodiment has the wiring layers 23a-23c and the two electrode units (electrostatic capacity detection electrodes 22) commonly connected by these wiring layers 23a-23c formed as a wiring pattern of an identical layer, hence does not require the through wiring 24 for connecting the wiring layer and the electrode unit like the electrostatic capacity sensor 2 according to the first embodiment. Therefore, a formation step of the wiring pattern can be simplified.

MODIFIED EXAMPLES OF GRIP DETECTION DEVICE

Modified examples of the grip detection device according to the first embodiment will be described below with reference to FIGS. 8 to 15. In FIGS. 8 to 15, configuration elements of an identical mode to those of the above-described first embodiment will be assigned with identical reference numerals to those assigned in the first embodiment, and descriptions thereof will be omitted.

Note that a characteristic configuration of the grip detection device of the present embodiment is being configured such that the electrostatic capacity sensor 2 mounted on the rim 11 of the steering wheel 1 includes a plurality of electrode units comprising an electrostatic capacity detection electrode of elongated shape, the plurality of electrode units extend along the direction in which the rim extends and are provided in parallel along the circumferential direction of the rim, and, in the plurality of electrode units, at least two electrode units are commonly connected, and at least one electrode unit not commonly connected to commonly connected two electrode units is disposed between the commonly connected two electrode units. In addition, a characteristic configuration of the grip detection device of the present embodiment is being configured such that the determination unit that detects gripping of the steering wheel by the driver based on proximity detection of the human body by the electrostatic capacity sensor 2 determines that the driver has gripped the steering wheel when proximity of the human body has been detected by at least two electrode units not commonly connected to each other.

Therefore, the number of electrode units configuring the electrostatic capacity sensor, the number of commonly connected electrode units, an arrangement interval of each of the electrode units, and an arrangement interval of the commonly connected electrode units can be appropriately changed.

For example, in the above-described first embodiment, the electrostatic capacity sensor 2 including six electrode units 2a-2f (electrostatic capacity detection electrodes 22) was mounted on the rim 11, and the six electrode units 2a-2f (electrostatic capacity detection electrodes 22) were commonly connected in pairs, but the number of electrode units (electrostatic capacity detection electrodes 22) or the number of commonly connected electrode units (electrostatic capacity detection electrodes 22) can be appropriately changed according to what kind of range is set for an angle range to distinguish gripping.

Moreover, in the above-described embodiment, the plurality of electrode units are provided in parallel at substantially equal intervals along the circumferential direction of the rim 11 and commonly connected electrode units are also disposed at substantially equal intervals, but the arrangement interval of the plurality of electrode units or the arrangement interval of the commonly connected electrode units can be appropriately changed according to grip detection performance required at each position in the circumferential direction of the rim.

First Modified Example

Figure 8:
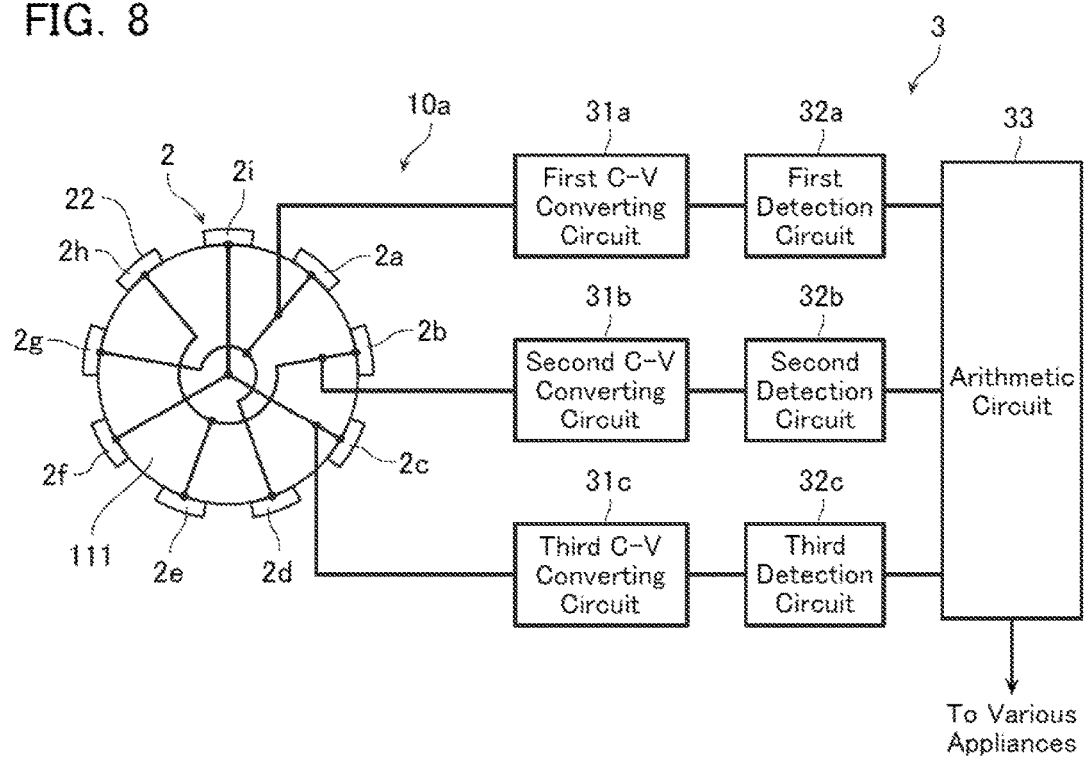
FIG. 8 is a block diagram of a grip detection device according to a first modified example.

In a grip detection device 10a according to a first modified example shown in FIG. 8, the electrostatic capacity sensor 2 includes nine electrode units 2a-2i (electrostatic capacity detection electrodes 22), and three wirings extend from the electrostatic capacity sensor 2 to the determination unit 3.

The nine electrode units 2a-2i (electrostatic capacity detection electrodes 22) are provided in parallel at substantially equal intervals (substantially 40° intervals) along the circumferential direction of the rim 11, and in those, three electrode units [2a, 2d, 2g], [2b, 2d, 2h], [2c, 2f, 2i] disposed at substantially 120° intervals are commonly connected each other as an identical group.

In this case, similarly to in the first embodiment, when only any one of the first through third detection circuits 32a-32c has become active, the driver is determined to have contacted the steering wheel (rim 11), and when two or all of the first through third detection circuits 32a-32c have become active, the driver is determined to have gripped the steering wheel (rim 11), whereby a gripping misdetection due to inadvertent contact of the steering wheel by the driver can be prevented, but the angle range when performing grip detection is smaller compared to in the first embodiment.

Second Modified Example

Figure 9:
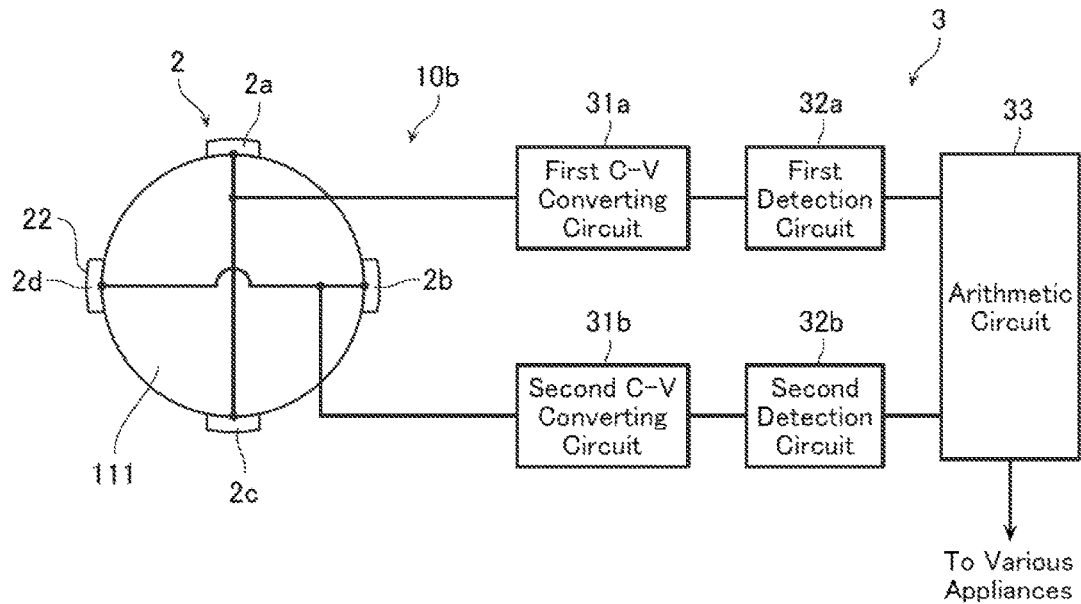
FIG. 9 is a block diagram of a grip detection device according to a second modified example.

In a grip detection device 10b according to a second modified example shown in FIG. 9, the electrostatic capacity sensor 2 includes four electrode units 2a-2d (electrostatic capacity detection electrodes 22), and two wirings extend from the electrostatic capacity sensor 2 to the determination unit 3.

The four electrode units 2a-2d (electrostatic capacity detection electrodes 22) are provided in parallel at substantially equal intervals (substantially 90° intervals) along the circumferential direction of the rim 11, and in those, two electrode units [2a, 2c], [2b, 2d] disposed at facing positions (substantially 180° intervals) are commonly connected each other as an identical group.

In this case, when either one of the first and second detection circuits 32a, 32b has become active, the driver is determined to have contacted the steering wheel (rim 11), and when both of the first and second detection circuits 32a, 32b have become active, the driver is determined to have gripped the steering wheel (rim 11), whereby a gripping misdetection due to inadvertent contact of the steering wheel by the driver can be prevented, but the angle range when performing grip detection is larger compared to in the first embodiment.

Third Modified Example

Figure 10:
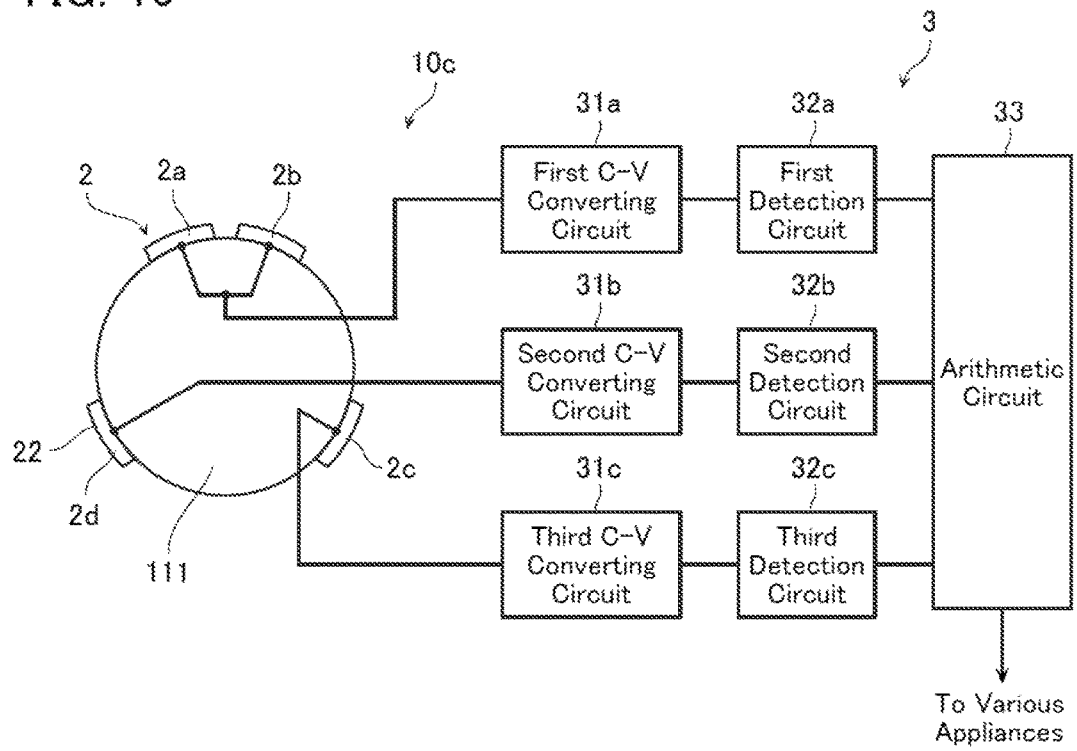
FIG. 10 is a block diagram of a grip detection device according to a third modified example.
Figure 11:
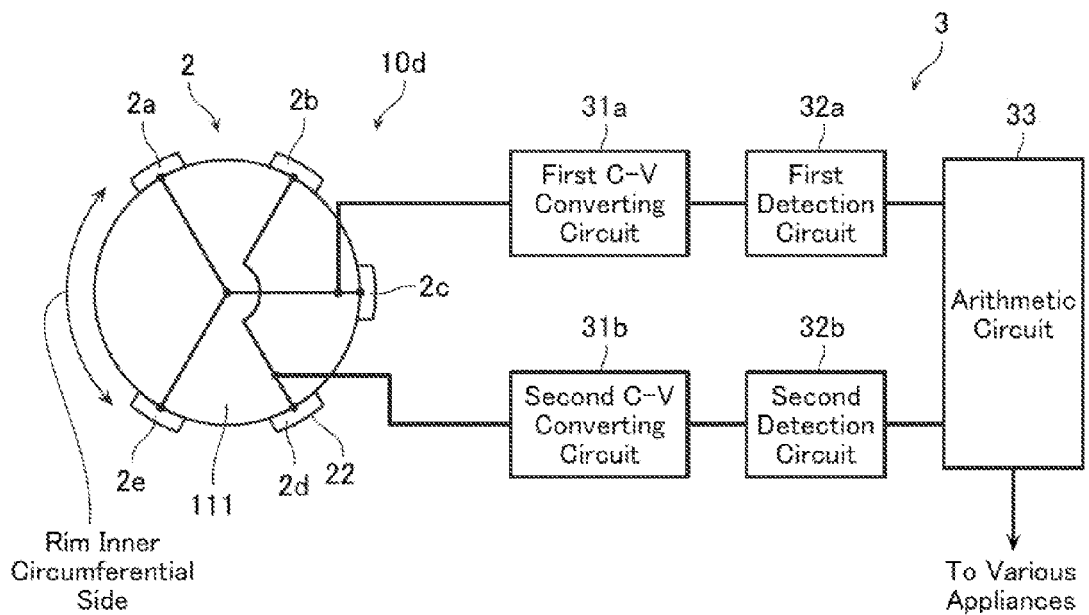
FIG. 11 is a block diagram of a grip detection device according to a fourth modified example.

In a grip detection device 10c according to a third modified example shown in FIG. 10, the electrostatic capacity sensor 2 includes four electrode units 2a-2d (electrostatic capacity detection electrodes 22), and three wirings extend from the electrostatic capacity sensor 2 to the determination unit 3.

The four electrode units 2a-2d (electrostatic capacity detection electrodes 22) are provided in parallel at unequal intervals along the circumferential direction of the rim 11. Moreover, in the four electrodes, two of the electrode units 2a, 2b (electrostatic capacity detection electrodes 22) disposed at positions closely adjacently to each other are commonly connected as an identical group, and are wired to the first detection circuit 32a. Moreover, in each of spaces (two spaces) between the commonly connected two electrode units 2a, 2b, one of the spaces has disposed therein each of the electrode unit 2c wired to the second detection circuit 32b and the electrode unit 2d wired to the third detection circuit 32c.

In this case, even if proximity of the human body is detected by the two electrode units 2a, 2b (electrostatic capacity detection electrodes 22) disposed at positions closely adjacent to each other, only the first detection circuit 32a becomes active, and by proximity of the human body being detected by a plurality of electrode units (electrostatic capacity detection electrodes 22) including at least one of the two electrode units 2c, 2d disposed at positions remote from each other, outputs of two or all of the first through third detection circuits 32a-32c become active.

Even in the present modified example, when only any one of the detection circuits 32a-32c has become active, the driver is determined to have contacted the steering wheel (rim 11), and when two or all of the detection circuits 32a-32c have become active, the driver is determined to have gripped the steering wheel (rim 11), whereby a gripping misdetection due to inadvertent contact of the steering wheel by the driver can be prevented.

Fourth Modified Example

For example, because the driver grips the rim 11 from an outer circumferential side of the steering wheel, even if the arrangement interval of the electrode units provided in parallel on the rim inner circumferential side is increased (the electrode arrangement density is decreased), an effect on grip detection performance is small. Accordingly, in a grip detection device 10d according to a fourth modified example shown in FIG. 11, the arrangement interval of the electrode units on the rim inner circumferential side is increased, whereby the number of electrode units is reduced.

In the grip detection device 10d according to the fourth modified example, the electrostatic capacity sensor 2 including five electrode units 2a-2e (electrostatic capacity detection electrodes 22) is mounted on the rim 11, and two wirings (wiring layers) extend from the electrostatic capacity sensor 2 to the determination unit 3. Moreover, the five electrode units 2a-2e provided in parallel along the circumferential direction of the rim 11 are provided in parallel at unequal intervals such that the arrangement interval of the electrode units on the rim inner circumferential side increases.

Specifically, the three electrode units 2a, 2c, 2e disposed at substantially equal intervals (substantially 120° intervals) along the circumferential direction of the rim 11 are commonly connected as an identical group and wired to the first detection circuit 32a, the electrode unit 2b not commonly connected to the commonly connected electrode units [2a, 2c] is disposed at the center between these commonly connected electrode units [2a, 2c], and the electrode unit 2d not commonly connected to the commonly connected electrode units [2c, 2e] is disposed at the center between these commonly connected electrode units [2c, 2e]. Moreover, an electrode unit is not disposed between the electrode units [2e, 2a] on the rim inner circumferential side. Moreover, the two electrode units 2b, 2d disposed between each of the electrode units [2a, 2c], [2c, 2e] are commonly connected as an identical group to be wired to the second detection circuit 32b.

That is, in a region excluding a substantially 120° range on the rim inner circumferential side, the five electrode units 2a-2e are provided in parallel at substantially equal intervals (substantially 60° intervals) along the circumferential direction of the rim 11, and furthermore, the three electrode units 2a, 2c, 2e commonly connected to the first detection circuit 32a and the two electrode units 2b, 2d commonly connected to the second detection circuit 32b are disposed alternately.

Even in the present modified example, when proximity of the human body has been detected by one electrode unit of the five electrode units provided in parallel along the circumferential direction of the rim 11, and only either one of the first or second detection circuits 32a, 32b has become active, the determination unit 3 determines that the driver has contacted the steering wheel (rim 11). Moreover, when, in a region other than the rim inner circumferential side, proximity of the human body has been detected by adjacent two electrode units, and outputs of both of the first and second detection circuits 32a, 32b have become active, the driver is determined to have gripped the steering wheel (rim 11). As a result, a gripping misdetection due to inadvertent contact of the steering wheel by the driver can be prevented.

Fifth Modified Example

Figure 12:
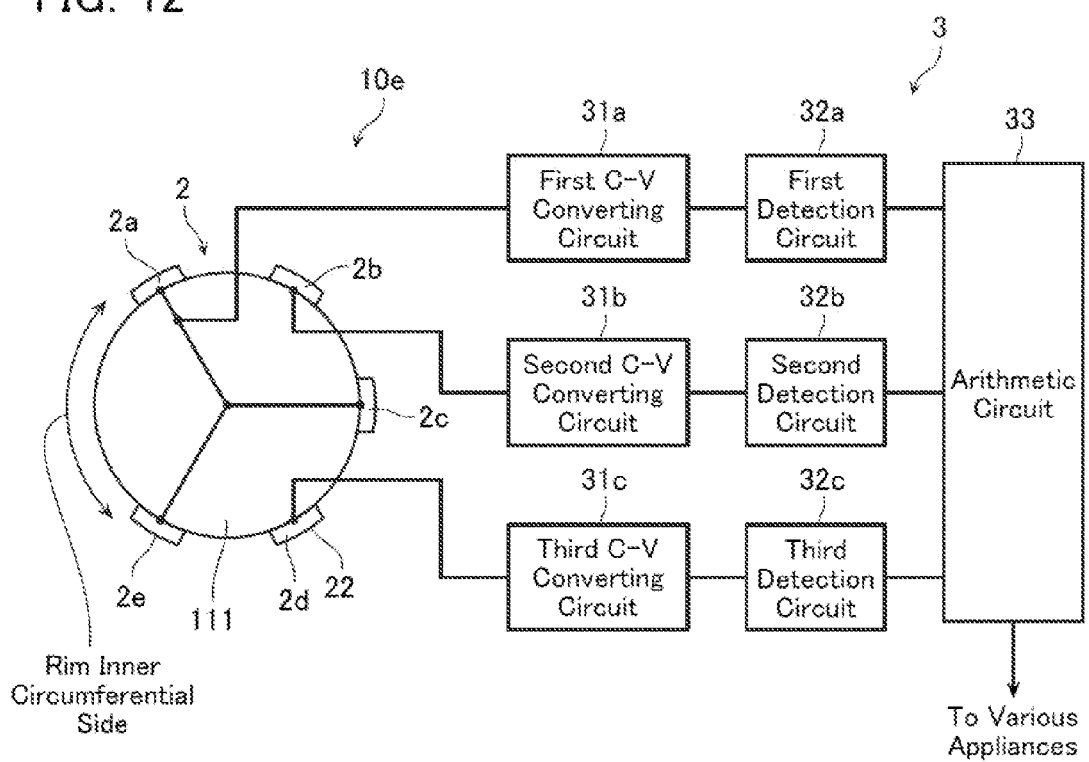
FIG. 12 is a block diagram of a grip detection device according to a fifth modified example.

In a grip detection device 10e according to a fifth modified example shown in FIG. 12, similarly to in the fourth modified example, the arrangement interval of the electrode units on the rim inner circumferential side is increased, whereby the number of electrode units is reduced.

In the grip detection device 10e according to the fifth modified example, the electrostatic capacity sensor 2 including five electrode units 2a-2e (electrostatic capacity detection electrodes 22) is mounted on the rim 11, and three wirings (wiring layers) extend from the electrostatic capacity sensor 2 to the determination unit 3. Moreover, the five electrode units 2a-2e provided in parallel along the circumferential direction of the rim 11 are disposed at unequal intervals such that the arrangement interval of the electrode units on the rim inner circumferential side increases.

Specifically, the three electrode units 2a, 2c, 2e disposed at substantially equal intervals (substantially 120° intervals) along the circumferential direction of the rim 11 are commonly connected as an identical group to be wired to the first detection circuit 32a, the electrode unit 2b not commonly connected to the commonly connected electrode units [2a, 2c] is disposed between these commonly connected electrode units [2a, 2c] to be wired to the second detection circuit 32b, and the electrode unit 2d not commonly connected to the commonly connected electrode units [2c, 2e] is disposed at the center between these commonly connected electrode units [2c, 2e] to be wired to the third detection circuit 32c. Moreover, similarly to in the fourth modified example, an electrode unit is not disposed between the electrode units [2e, 2a] on the rim inner circumferential side.

That is, the present modified example differs from the fourth modified example in that the electrode units 2b, 2d are not commonly connected and are respectively wired to the second or third detection circuits 32b, 32c.

Sixth Modified Example

Figure 13:
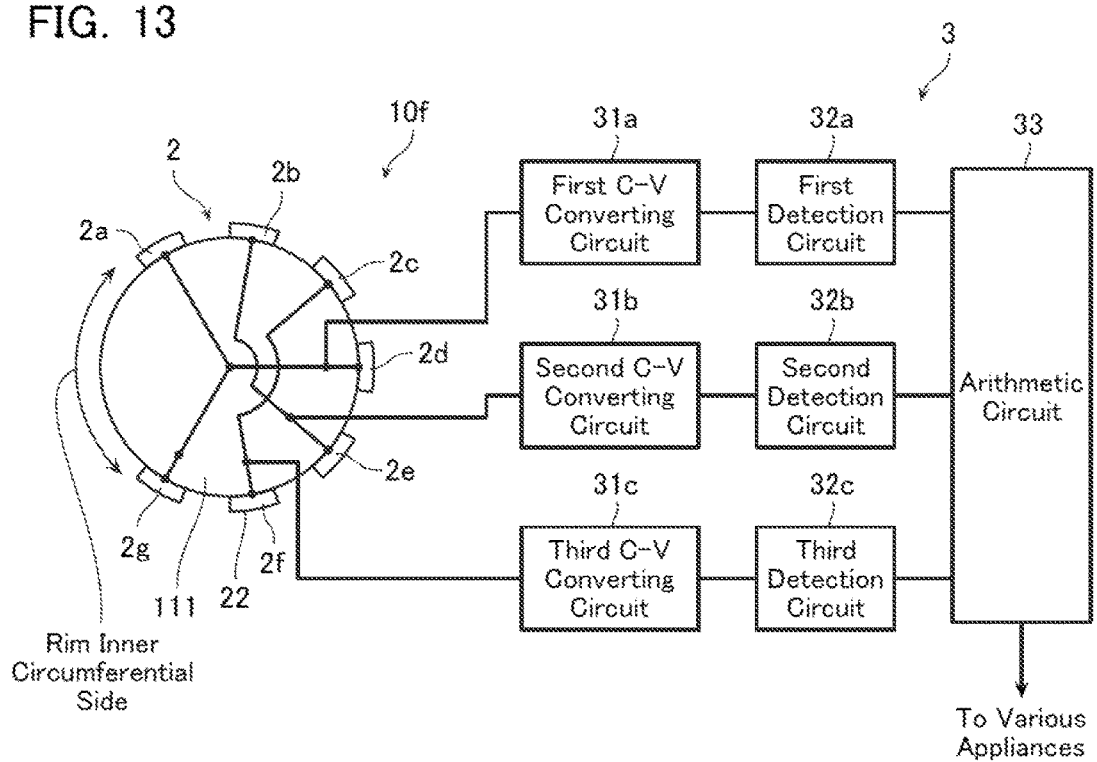
FIG. 13 is a block diagram of a grip detection device according to a sixth modified example.

In a grip detection device 10f according to a sixth modified example shown in FIG. 13, similarly to in the fourth modified example, the arrangement interval of the electrode units on the rim inner circumferential side is increased, whereby the number of electrode units is reduced.

In the grip detection device 10f according to the sixth modified example, the electrostatic capacity sensor 2 including seven electrode units 2a-2g (electrostatic capacity detection electrodes 22) is mounted on the rim 11, and three wirings (wiring layers) extend from the electrostatic capacity sensor 2 to the determination unit 3. Moreover, the seven electrode units 2a-2g provided in parallel along the circumferential direction of the rim 11 are disposed at unequal intervals such that the arrangement interval of the electrode units on the rim inner circumferential side increases.

Specifically, the three electrode units [2a, 2d, 2g] disposed at substantially equal intervals (substantially 120° intervals) along the circumferential direction of the rim 11 are commonly connected as an identical group to be wired to the first detection circuit 32a, the two electrode units 2b, 2c not commonly connected to the commonly connected electrode units [2a, 2d] are disposed at substantially equal intervals (substantially 40° intervals) between these commonly connected electrode units [2a, 2d], and the two electrode units 2e, 2f not commonly connected to the commonly connected electrode units [2d, 2g] are disposed at substantially equal intervals (substantially 40° intervals) between these commonly connected electrode units [2d, 2g]. Moreover, an electrode unit is not disposed between the electrode units [2g, 2a] on the rim inner circumferential side. Moreover, the two electrode units 2b, 2e disposed at substantially 120° intervals are commonly connected to be wired to the second detection circuit 32b, and the two electrode units 2c, 2f disposed at substantially 120° intervals are commonly connected to be wired to the third detection circuit 32c.

That is, the present modified example differs from the first modified example in that an electrode unit is not disposed between the commonly connected two electrode units [2g, 2a] disposed on the rim inner circumferential side.

Seventh Modified Example

Figure 14:
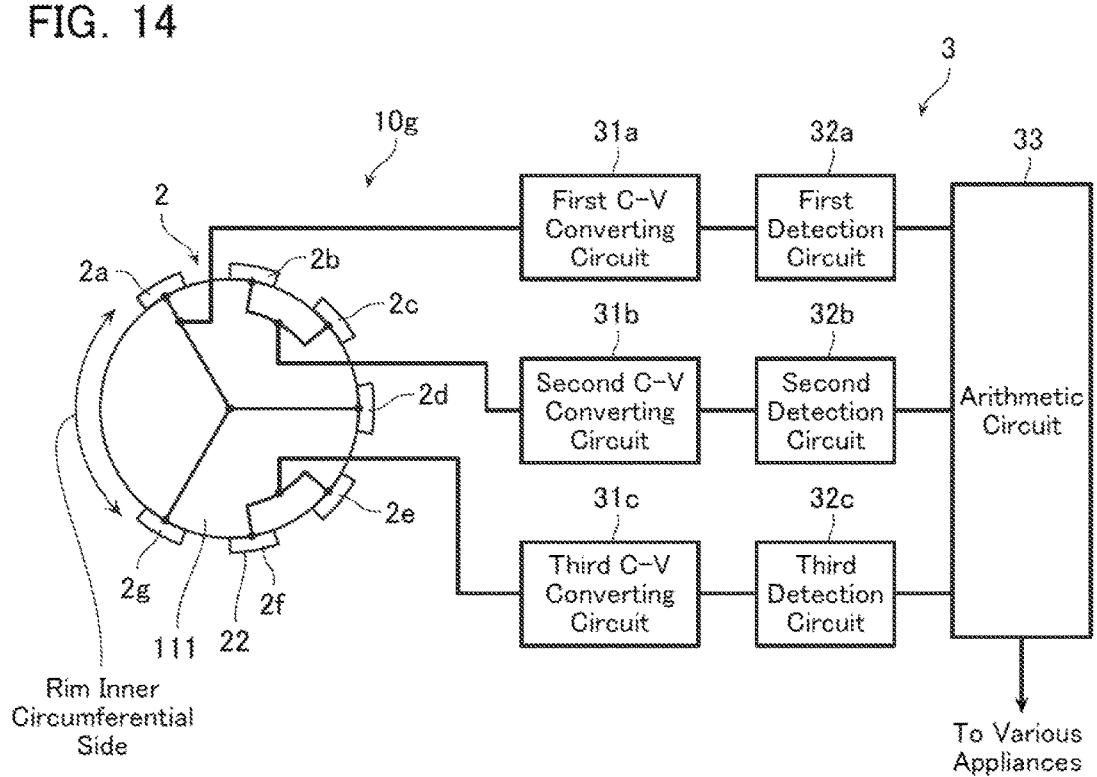
FIG. 14 is a block diagram of a grip detection device according to a seventh modified example.

In a grip detection device 10g according to a seventh modified example shown in FIG. 14, similarly to in the fourth modified example, the arrangement interval of the electrode units on the rim inner circumferential side is increased, whereby the number of electrode units is reduced.

In the grip detection device 10g according to the seventh modified example, the electrostatic capacity sensor 2 including seven electrode units 2a-2g (electrostatic capacity detection electrodes 22) is mounted on the rim 11, and three wirings (wiring layers) extend from the electrostatic capacity sensor 2 to the determination unit 3. Moreover, the seven electrode units 2a-2g provided in parallel along the circumferential direction of the rim 11 are disposed at unequal intervals such that the arrangement interval of the electrode units on the rim inner circumferential side increases.

Specifically, the three electrode units [2a, 2d, 2g] disposed at substantially equal intervals (substantially 120° intervals) along the circumferential direction of the rim 11 are commonly connected as an identical group to be wired to the first detection circuit 32a, the two electrode units 2b, 2c not commonly connected to the commonly connected electrode units [2a, 2d] are disposed at substantially equal intervals (substantially 40° intervals) between these commonly connected electrode units [2a, 2d], and the two electrode units 2e, 2f not commonly connected to the commonly connected electrode units [2d, 2g] are disposed at substantially equal intervals (substantially 40° intervals) between these commonly connected electrode units [2d, 2g]. Moreover, an electrode unit is not disposed between the electrode units [2g, 2a] on the rim inner circumferential side. Moreover, the two electrode units 2b, 2c disposed between the commonly connected two electrode units [2a, 2d] are commonly connected to be wired to the second detection circuit 32b, and the two electrode units 2e, 2f disposed between the commonly connected two electrode units [2d, 2g] are commonly connected to be wired to the third detection circuit 32c.

That is, in the present modified example, a common wiring of a plurality of the electrode units respectively disposed between two of the electrode units of the commonly connected three electrode units [2a, 2d, 2g], differs from the sixth modified example.

Eighth Modified Example

Figure 15:
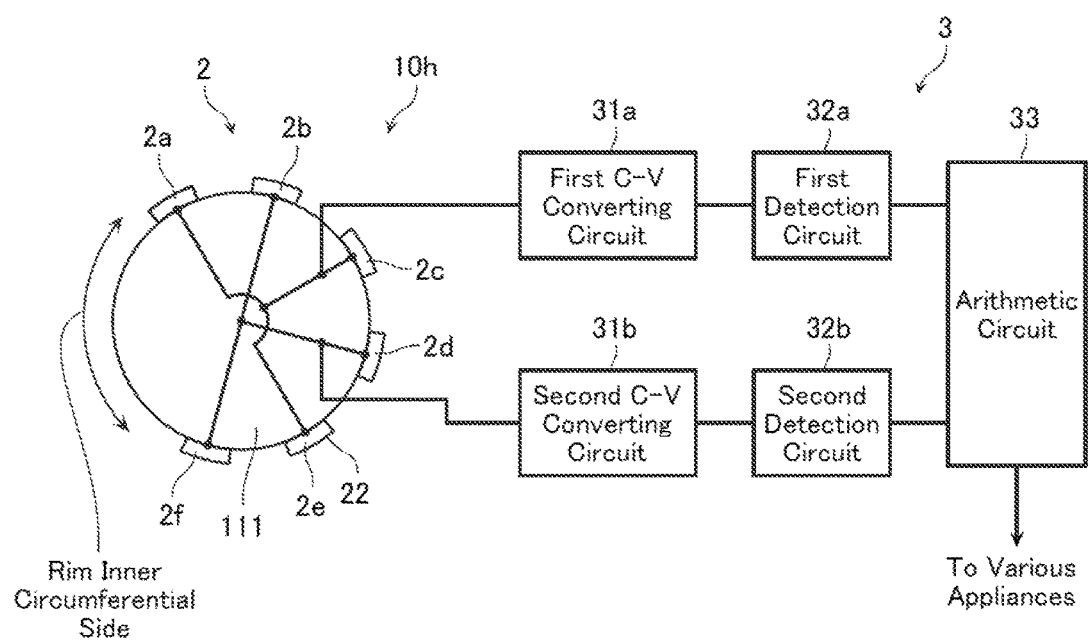
FIG. 15 is a block diagram of a grip detection device according to an eighth modified example.

In a grip detection device 10h according to an eighth modified example shown in FIG. 15, similarly to in the fourth modified example, the arrangement interval of the electrode units on the rim inner circumferential side is increased, whereby the number of electrode units is reduced.

In the grip detection device 10h according to the eighth modified example, the electrostatic capacity sensor 2 including six electrode units 2a-2f (electrostatic capacity detection electrodes 22) is mounted on the rim 11, and two wirings (wiring layers) extend from the electrostatic capacity sensor 2 to the determination unit 3. Moreover, the six electrode units 2a-2f provided in parallel along the circumferential direction of the rim 11 are disposed at unequal intervals such that the arrangement interval of the electrode units on the rim inner circumferential side increases.

Specifically, in a region other than the rim inner circumferential side, the six electrode units 2a-2f are provided in parallel along the circumferential direction of the rim so as to be at substantially 45° intervals. Moreover, of the six electrode units 2a-2f the three electrode units [2a, 2c, 2e] disposed at substantially 90° intervals along the circumferential direction of the rim 11 are commonly connected as an identical group to be wired to the first detection circuit 32a, and the three electrode units [2b, 2d, 2f] disposed at 90° intervals along the circumferential direction of the rim 11 are commonly connected as an identical group to be wired to the second detection circuit 32b. Moreover, an electrode unit is not disposed between the two electrode units [2f, 2a] on the rim inner circumferential side.

Even in the grip detection device according to any of the fifth through eighth modified examples, similarly to in the grip detection device according to the fourth modified example, a gripping misdetection due to inadvertent contact of the steering wheel by the driver can be prevented. Moreover, since the arrangement interval of the electrode units provided in parallel on the rim inner circumferential side has been increased (the electrode arrangement density has been decreased), the number of electrode units can be reduced.

DESCRIPTION OF REFERENCE NUMERALS 1 steering wheel main body
2 electrostatic capacity sensor
2a-2i electrode unit
23 contact wiring
3 determination unit
10, 10a-10h grip detection device
11 rim
12 center unit
21 flexible substrate
21a-21c flexible substrate piece
22 electrostatic capacity detection electrode
23a-23c wiring layer
24 through wiring
25 insulating layer
31a-31c C-V converting circuit
32a-32c detection circuit
33 arithmetic circuit
111 core material
112 cushioning material
113 steering skin

The invention claimed is:

1. A grip detection device, comprising:
  a steering wheel;
  an electrostatic capacity sensor mounted on a rim of said steering wheel: and
  a determination unit that determines whether a driver has gripped the steering wheel or not based on proximity detection of a human body by said electrostatic capacity sensor,
  wherein
  said electrostatic capacity sensor includes a plurality of electrode units comprising an electrostatic capacity detection electrode of elongated shape,
  a plurality of said electrode units extend along a direction in which said rim extends, and are provided in parallel along a circumferential direction of said rim having the direction in which said rim extends as its axial center,
  furthermore, in a plurality of said electrode units, at least two electrode units are commonly connected, and at least one electrode unit not commonly connected to the commonly connected two electrode units is disposed between the commonly connected two electrode units, and
  said determination unit determines that the driver has gripped the steering wheel when proximity of the human body has been detected by each of at least two electrode units not commonly connected to each other,
  a plurality of the electrode units are divided into at least three groups, and electrode units belonging to an identical group are commonly connected each other, and
  the determination unit determines that the driver has gripped the steering wheel when proximity of the human body has been detected by one electrode unit and other electrode unit belonging to different group from the one electrode unit.

2. The grip detection device according to claim 1, wherein the proximity of the human body is detected by the one electrode unit separately and independently from the other electrode unit belonging to the different group from the one electrode unit, and the proximity of the human body is detected by the other electrode unit separately and independently from the one electrode unit.

3. The grip detection device according to claim 1, wherein a plurality of said electrode units are provided in parallel along a circumferential direction of said rim, such that adjacent electrode units belong to different groups each other.

4. A grip detection device, comprising:
a steering wheel;
an electrostatic capacity sensor mounted on a rim of said steering wheel; and
a determination unit that determines whether a driver has gripped the steering wheel or not based on proximity detection of a human body by said electrostatic capacity sensor,
wherein
said electrostatic capacity sensor includes a plurality of electrode units comprising an electrostatic capacity detection electrode of elongated shape,
a plurality of said electrode units extend along a direction in which said rim extends, and are provided in parallel along a circumferential direction of said rim having the direction in which said rim extends as its axial center,
furthermore, in a plurality of said electrode units, at least two electrode units are commonly connected, and at least one electrode unit not commonly connected to the commonly connected two electrode units is disposed between the commonly connected two electrode units, and
said determination unit determines that the driver has gripped the steering wheel when proximity of the human body has been detected by each of at least two electrode units not commonly connected to each other,
a plurality of said electrode units are divided into at least three groups, and electrode units belonging to an identical group are commonly connected each other, and
said determination unit determines that the driver has gripped the steering wheel when proximity of the human body has been detected by each of at least one electrode unit of all of different groups.

5. The grip detection device according to claim 4, wherein a plurality of said electrode units are provided in parallel along a circumferential direction of said rim, such that adjacent electrode units belong to different groups each other.

6. A grip detection device, comprising:
a steering wheel;
an electrostatic capacity sensor mounted on a rim of said steering wheel: and
a determination unit that determines whether a driver has gripped the steering wheel or not based on proximity detection of a human body by said electrostatic capacity sensor,
wherein
said electrostatic capacity sensor includes a plurality of electrode units comprising an electrostatic capacity detection electrode of elongated shape,
a plurality of said electrode units extend along a direction in which said rim extends, and are provided in parallel along a circumferential direction of said rim having the direction in which said rim extends as its axial center,
furthermore, in a plurality of said electrode units, at least two electrode units are commonly connected, and at least one electrode unit not commonly connected to the commonly connected two electrode units is disposed between the commonly connected two electrode units, and
said determination unit determines that the driver has gripped the steering wheel when proximity of the human body has been detected by each of at least two electrode units not commonly connected to each other,
a plurality of said electrode units are divided into at least two groups, and electrode units belonging to an identical group are commonly connected each other,
said determination unit determines that the driver has gripped the steering wheel when proximity of the human body has been detected by each of one electrode unit and an electrode unit belonging to a different group from the one electrode unit,
a plurality of said electrode units are provided in parallel along a circumferential direction of said rim, such that adjacent electrode units belong to different groups each other.

* * * * *